United States Patent [19]
Briones

[11] Patent Number: 5,431,735
[45] Date of Patent: Jul. 11, 1995

[54] PHOSPHORUS EFFUSION CELL FOR MOLECULAR BEAM EPITAXY

[75] Inventor: Fernando F. Briones, Madrid, Spain

[73] Assignee: Riber S.A., Rueil Malmaison Cedex, France

[21] Appl. No.: 181,802

[22] Filed: Jan. 14, 1994

[30] Foreign Application Priority Data

Jan. 14, 1993 [ES] Spain ................... 9300063

[51] Int. Cl.[6] .............................................. C23C 16/00
[52] U.S. Cl. ................... 118/725; 118/719; 118/724
[58] Field of Search ................ 118/719, 725, 724; 437/126, 105

[56] References Cited

U.S. PATENT DOCUMENTS 5,041,719  8/1991  Harris et al. ............... 118/725
5,156,815  10/1992  Streetman et al. ............ 437/107

FOREIGN PATENT DOCUMENTS 0132322  1/1985  European Pat. Off. .
0154072  9/1985  European Pat. Off. .

Primary Examiner—R. Bruce Breneman
Assistant Examiner—Ramamohan Rao
Attorney, Agent, or Firm—Handal & Morofsky

[57] ABSTRACT

A phosphorus effusion cell for molecular beam epitaxy is disclosed. It consists of a vessel in which, by sublimation of red phosphorus, the vapor of this element is produced, the vessel being closed by means of a vacuum tight valve which regulates its flow. In the vessel, there are two zones having different temperatures, one of sublimation of red phosphorus and another of condensation and re-evaporation of white phosphorus, both zones being thermally insulated by means of reflecting screens which prevent the temperature of the heating resistance from having to reach temperatures above 350° C. The valve, intermittent closing of which regulates the effusion of phosphorus vapor, is at a temperature slightly above that of the thermostated zone of condensation/re-evaporation of the white phosphorus. It finds applicable in the manufacture of semiconducting structures.

30 Claims, 10 Drawing Sheets

PHOSPHORUS EFFUSION CELL FOR MOLECULAR BEAM EPITAXY

TECHNICAL FIELD

The present invention relates to a phosphorus effusion cell capable of outputting a phosphorus beam useful in molecular beam epitaxy (abbreviated to "MBE" herein). MBE is based on the chemical reaction of molecular beams of elements of group III of the Periodic System (Ga, Al, In) and of group V (P, As, Sb) on the surface of crystalline substrates at high temperature and under UHV conditions. The molecular beams are generated in effusion cells by thermal sublimation or evaporation of the corresponding or solid elements.

BACKGROUND

The control of the thicknesses and composition of the different epitaxial layers which participate in a complex semiconducting structure is achieved by acting on the molecular beams by means of appropriate screens or valves. In particular, for the controlled production of molecular beams of arsenic ($As_4$) from the thermal sublimation of solid arsenic, effusion cells in which the opening/closing screen has been replaced by a rapid-actuation valve maintained at high temperature, to prevent condensation of the $As_4$ molecules therein, have been designed in the Centro Nacional de Microelectronica [National Microelectronics Centro] (C.S.I.C.) and employed successfully.

The crucible or vessel in which the arsenic is sublimed is leak-tight, except for the above-mentioned valve which opens it to the epitaxy reactor, and an auxiliary valve which connects it to a vacuum system. The vessel is maintained at a uniform temperature of the order of 300°-350° C. to obtain flows of $As_4$ with an equivalent beam pressure in the range $10^{-6}$–$10^{-5}$ mbar. For the production of molecular beams of $As_2$, a nozzle provided with tantalum surfaces at high temperature, which are capable of thermally dissociating $As_4$ molecules to $As_2$, was added. At the present time, the company EPI[2] [III-Vs Feature Review, 4(3), 31 (1990)] commercially produces a cell for $As_4$ and $As_2$ which utilizes the same principle and arrangement as the one described above.

When this type of cell was used for the production of molecular beams of $P_4$ or $P_2$ from the sublimation of solid phosphorus (red variety), great difficulties arose, both with the CNM cell and with the EPI cell. In particular, at the operating temperature of the cell 300° C., necessary for obtaining an equivalent beam pressure of the order of $10^{-5}$–$10^{-6}$ mbar in the steady state (valve open), a gradual rise takes place in the internal pressure in the cell (valve closed), leading to a strong equivalent beam pressure transient, or pressure burst, at the time of opening the valve. This transient makes it difficult to control the epitaxial process and is detrimental to the UHV pumps. U.S. Pat. No. 5,156,815 Streetman et al. discloses an arsenic effusion cell, or sublimation and cracking apparatus in which arsenic is sublimed in a primary furnace or sublimator 12 at temperatures of the order of 235° C. and is cracked in a perpendicular cracker at temperatures that are preferably in the range of 750° to 1050° C. The lower end of cracker 14 is described by Streetman et al. as providing a heat sink zone between the cracker and the sublimator (column 4, lines 29-55, column 6, lines 11-24 and column 10, lines 17-31). This heat sink zone, is obtained by restricting the extent of heater filament 78 to an upper portion of cracker 14 and by circulating a, probably gaseous, coolant through a cooling jacket 70 surrounding a lower end of sublimator 12. This exposed, lower heat sink end of cracker tube 18 serves the purpose of minimizing undesired heat transfer between the cracking and sublimator sections.

The heat sink zone is described by Streetman as having a substantially lower operation temperature than the temperature of the primary cracking zone. The lower temperature of the heat sink zone is however substantially above that of the sublimator 12 because of a much higher cracking temperature and because of heat transmission down the cracking tube 18. Streetman et al.'s heat sink zone serves to prevent back transfer of heat from the cracker to the sublimator leading to overpressure due to enhanced sublimation of arsenic. While it may have been suggested to use arsenic effusion cells to generate phosphorus beams, Streetman et al.'s sublimation and cracking apparatus is not designed as a phosphorus effusion cell and provides no means to solve the problems that arise in subliming and cracking phosphorus, specifically the problem of an initial pressure surge and providing a readily controllable, reproducible phosphorus beam.

A further crucial drawback to employing the Streetman et al. teaching for propagating a phosphorus beam for use in MBE is the lack of efficient flux control valving means. Streetman et al. constrained by a high-temperature environment provides only a crude shutter 112 pivoting on a hinge 114, which is neither vacuum-tight nor rapid-acting.

A problem with prior proposals is that they are either unaware of, or have underestimated, the quantity of white phosphorus which is formed by condensation as a result of evaporation of red phosphorus and the pressure impact it creates The $P_4$ pressure of white phosphorus at 300° C., a suitable red phosphorus evaporation temperature, is close to 1 bar. This is an enormous pressure compared with desired beam equivalent pressures of about four-millionths of a bar.

The high internal white phosphorus pressures of known cell effusion systems, such as those used for arsenic mean that each time the valve between the sublimation furnace and the cracker is opened, a large burst of pressure is produced. The MBE growth chamber into which this burst of pressure is discharged cannot sustain such high pressure and may require several hours to recover to a practical working pressure. Also the large amount of phosphorus blown into the growth chamber will inevitably provide a high residual background of phosphorus even in subsequent processes where phosphorus may not be required.

A further drawback of known systems is that a stable state is only reached after a long period with the valve constantly open. This is an unacceptable impediment to most researchers or fabricators using molecular phosphorus beams. Such instabilities makes it difficult or impossible for researchers and fabricators to rely upon a particular beam equivalent pressure for accurate calibration of Group III and other Group V fluxes, or to gain flux reproducibility.

SUMMARY OF THE INVENTION

This invention solves a problem. It solves the problem of providing a phosphorus effusion cell capable of producing a controlled phosphorus beam suitable for use in molecular beam epitaxy processes.

I have found that an important drawback of known effusion cells such as the Streetman et al. arsenic cracking cell is that if used for phosphorus they produce a phosphorus beam containing $P_4$ molecules which condense out as solid white phosphorus on the internal parts of the molecular beam epitaxy chamber. Solid white phosphorus is a volatile, dangerous material, which ignites spontaneously, or explodes in the presence of air and can contaminate vacuum pumps.

Whereas the inadvertent formation of white phosphorus may be seen as a cause of phosphorus effusion cell pressure surge problems, in my invention I have turned this phenomenon to good effect and used it to provide a significantly improved phosphorus effusion cell. By deliberately depositing white phosphorus from vapor, and then re-evaporating it, a controllable, high volatility phosphorus-vapor source is created which is subject to precise management by simple thermostatic means, which eliminates the surge problem and provides other advantages.

In one aspect the invention provides a phosphorus effusion cell for molecular beam epitaxy, consisting of a vessel, closed by means of a vacuum-tight valve which regulates its flow, in which, by sublimation of red phosphorus, the vapor of this element is produced., wherein in the vessel, there are two zones having different temperatures, one hot, of subliming red-phosphorus producing $P_4$ vapor, and another, cold, of condensation in the form of white phosphorus and re-evaporation of the latter; the two zones are thermostated independently. The output is cracked or supplied to a phosphorus cracker to generate the desired phosphorus beam. In other words, the phosphorus stream to the cracker is processed in two stages, with a pronounced temperature drop from sublimation to condensation leading to distinct phosphorus phase changes.

In another aspect the invention provides a phosphorus effusion cell having a relatively high temperature phosphorus cracker and a relatively lower temperature phosphorus evaporator which incorporates a flux control valve that is sealable against high vacuum and controllable with precision and reproducibility. This is achieved by using low temperature valving with an elastomeric seal, operating on a low temperature phosphorous stream.

While the invention disclosed herein is not bound by any particular theory, it appears that the rise in the internal pressure is the outcome of the coexistence of two phases or allotropic states of phosphorus, red phosphorus of low vapor pressure, which is obtained by condensation of $P_2$ molecules, and white phosphorus of high vapor pressure (see vapor pressure curves in FIG. 1), which is obtained by condensation of $P_4$ molecules. However, sublimation of red phosphorus at 300° C. gives rise to $P_4$ molecules. At equilibrium, with the valve closed, the internal pressure is determined by the phase of higher vapor pressure, white phosphorus, pressures of the order of one bar or one atmosphere being reached at 300° C.

BRIEF DESCRIPTION OF THE DRAWINGS

Some embodiments of the invention, including the best known embodiment, will now be described in detail below with reference to the accompanying drawings which illustrate only one specific embodiment of the invention and in which.

DETAILED DESCRIPTION OF THE PREFERRED EMBODIMENTS

Figure 2:
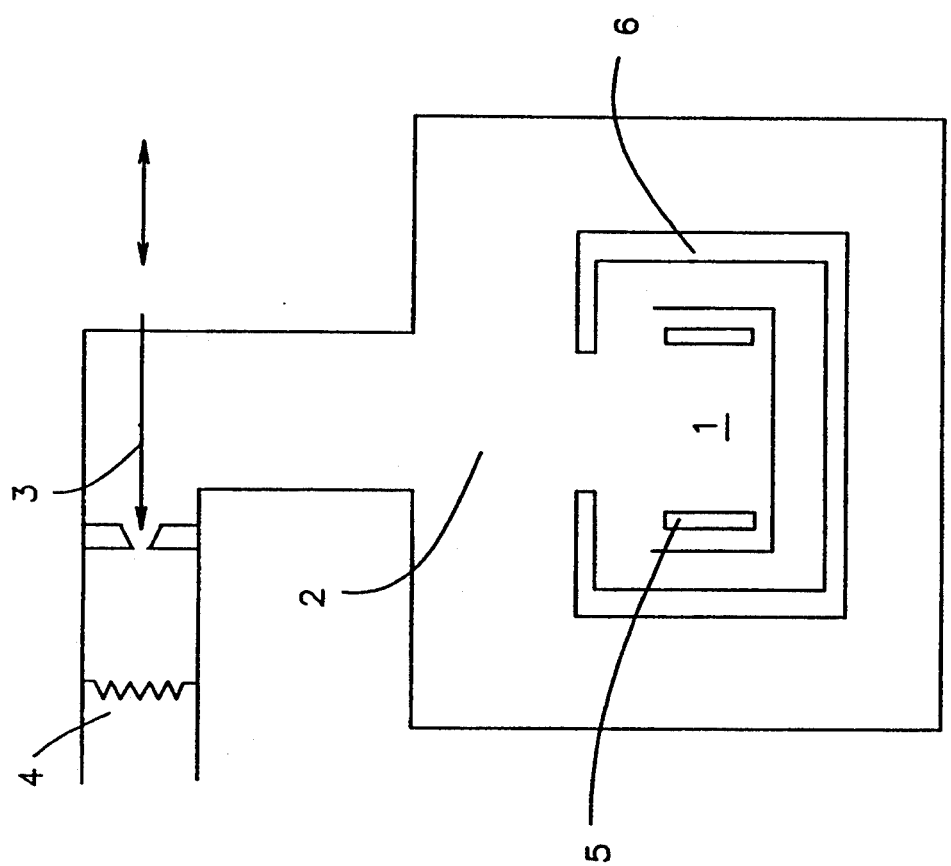
FIG. 2 is a schematic sectional view of one embodiment of inventive phosphorus effusion cell.

Embodiment of FIG. 2

Referring to FIG. 2 the phosphorus effusion cell shown provides a hot thermostated evaporation zone comprising a crucible 1 containing red phosphorus and a cold thermostated condenser zone 2 where white phosphorus is condensed and re-evaporated.

The cell further comprises a rapid-actuation valve 3, and a thermostated electrical resistance phosphorus cracker 4. Independent thermostating systems for the evaporator crucible 1, the condenser 2 and the cracker 3 are shown at 5, 6 and 7 respectively.

The phosphorus effusion cell consists (FIG. 2) of a closed vessel in which there are two zones having different temperatures, one, hot, in which red phosphorus sublimes 1, and another, colder, of condensation and re-evaporation of white phosphorous 2; the vessel communicates with the device to which the phosphorus effuses by means of vacuum-tight valve 3.

The condensation zone 2, preferably thermostated at 30° C. (in no case at more than 100° C.), determines the vapor pressure of the $P_4$ in the vessel, which vapor flows out through the valve 3 with which, by means of intermittent closing and of regulation of the clear section when it is open, the flow of phosphorus vapor is regulated; the said valve should be maintained at a temperature above that of the condensation chamber so as to prevent phosphorus from condensing on it.

Lastly, when the vapor passes through the valve, thermal dissociation of $P_4$ to $P_2$ is produced by means of an electrical resistance 4 of refractory metal (for example tantalum).

The two zones, hot 1 and cold 2 and the valve 3 are thermostated independently by the corresponding systems 5, 6 and 7.

In the effusion cell which is the subject of this patent, the problem of the excess pressure caused by the formation of white phosphorus has been avoided by using an airtight vessel with a valve, as described in the prior art, but dividing the said vessel into two zones having different temperatures instead of a single zone having a uniform temperature.

Figure 3:
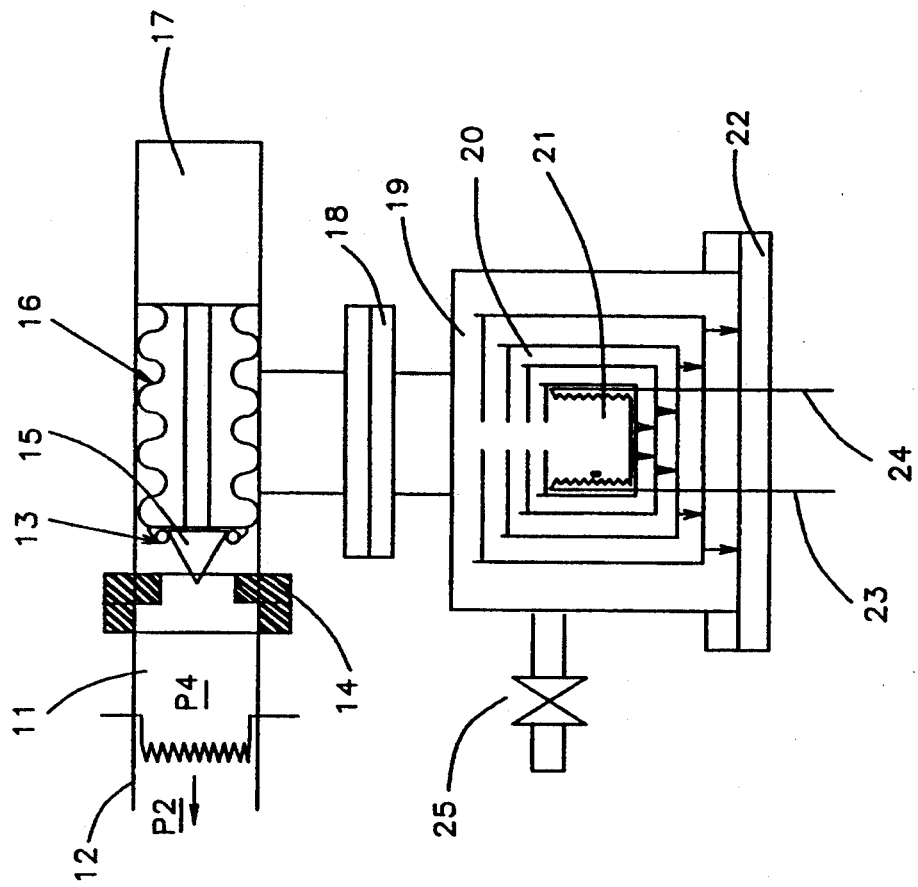
FIG. 3 is a view similar to FIG. 2 showing another embodiment of phosphorus effusion cell in somewhat more detail.

Embodiment of FIG. 3

In the embodiment shown in FIG. 3, a phosphorus effusion tube 11 contains a preferably tantalum electrical resistance 12 for the thermal or thermal catalytic dissociation of $P_4$. A conical valve member 15, carried and sealed by a bellows 16, bears a valve seal 13 which can be, for example, an elastomeric O-ring, e.g. made of VITON (trademark), for hermetic sealing of the cell. Valve member 15 is driven by a pneumatic system 17 (or equivalent electrical mechanism) for actuation of the valve which may be electronically controlled by computer-compatible means, if desired. Valve seal 13 can be of any suitable material and structure which ensures a hermetic, leak-tight closure in the high-vacuum, low-pressure environment of the phosphorus effusion tube 11, for example a soft metal seal such as copper or aluminum. Alternatively, a leak-tight seal may be assured by pressing an exceptionally hard-surfaced member, for example, of sapphire, against a soft metal seal.

Vacuum flange 18 provides a separable unit attachable to cold chamber 19 with thermostated walls. Thermal insulation 20 which is suitable for ultra-high vacuum (UHV) use, comprises for example concentric spot-welded cylinders of tantalum foil or sheet, and lines a crucible 21 for subliming red phosphorus. Vacuum flange 22 has through-connectors and provides support for the cell.

Furnace heating resistance 23 for crucible 21 is controlled by temperature sensor or thermocouple 24. An optional vacuum valve 25 is provided for pumping out the cell.

With the object of providing a better explanation of the present invention, one of the possible modes of construction of the phosphorus effusion cell has been detailed in FIG. 3. The high temperature zone (at ~300° C.), in which red phosphorus sublimes to produce $P_4$, is located in a crucible 21, thermally insulated under vacuum by means of appropriate screens 20 and electrically heated by means of a resistance 23, the temperature of which is monitored by a sensor (thermocouple, for example) 24.

The internal pressure of the cell is controlled by the temperature of the colder zone, which corresponds to the outer walls of the vessel 19, which are thermostated at a temperature below 100° C., so that the aforementioned pressure is maintained in the range $10^{-2}$–$10^{-0}$ mbar, an entirely suitable range for obtaining an equivalent beam pressure of the order of $10^{-5}$–$10^{-6}$ mbar with the valve open.

The internal pressure is stabilized by the equilibrium of condensation/sublimation of white phosphorus deposited on the cold zone of the cell, and is maintained practically constant on opening or closing the valve. The transient occurring on opening, which takes place, as explained, with the cells described in the prior art, is thereby avoided.

The valve is composed of an assembly made up of a piece 15 with a conical projection and a flat part into which an O-ring 14, responsible for producing the hermetic seal, is fitted; the conical projection possessed the same degree of taper as the hole in the flange 3, so that, by adjusting the maximum separation of 5 during opening, the clear section for passage of vapor is varied, the maximum flow being regulated in this way. The valve assembly includes an elastic bellows 16 to allow the shaft to move while avoiding leaks, and an actuating system 17, preferably pneumatic. To avoid the condensation of phosphorus on the valve, the latter is maintained at a temperature above that of the cold zone 19.

Consequently, as a result of the valve being at a low temperature (the cold zone can be at 30° C. and the valve at 100° C., for example), it is possible to use sealing rings 14 of elastomeric material, a reproducible hermetic seal being obtained with a low force of actuation. Thus, valve O-ring or seal 14 can be of any suitable material and structure which ensures a hermetic, leak-tight closure in the high-vacuum, low-pressure environment of the valve, for example a soft metal seal such as copper or aluminum. Alternatively, a leak-tight seal may be assured by pressing an exceptionally hard-surfaced member, for example, of sapphire, against a soft metal seal.

Physical Chemistry of Phosphorus

Figure 1:
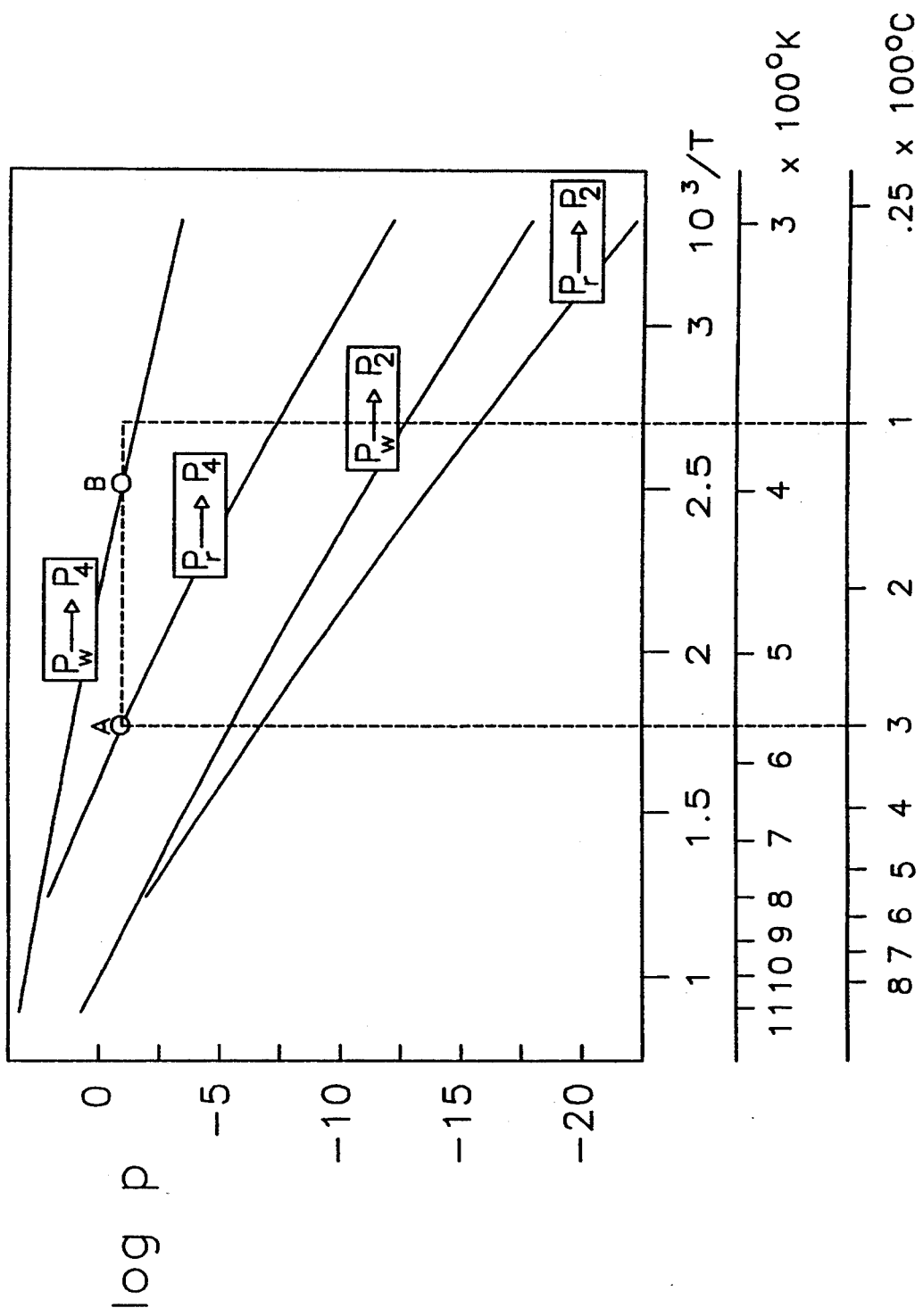
FIG. 1 shows known vapor pressure curves for different phases of phosphorus.
Figure 4:
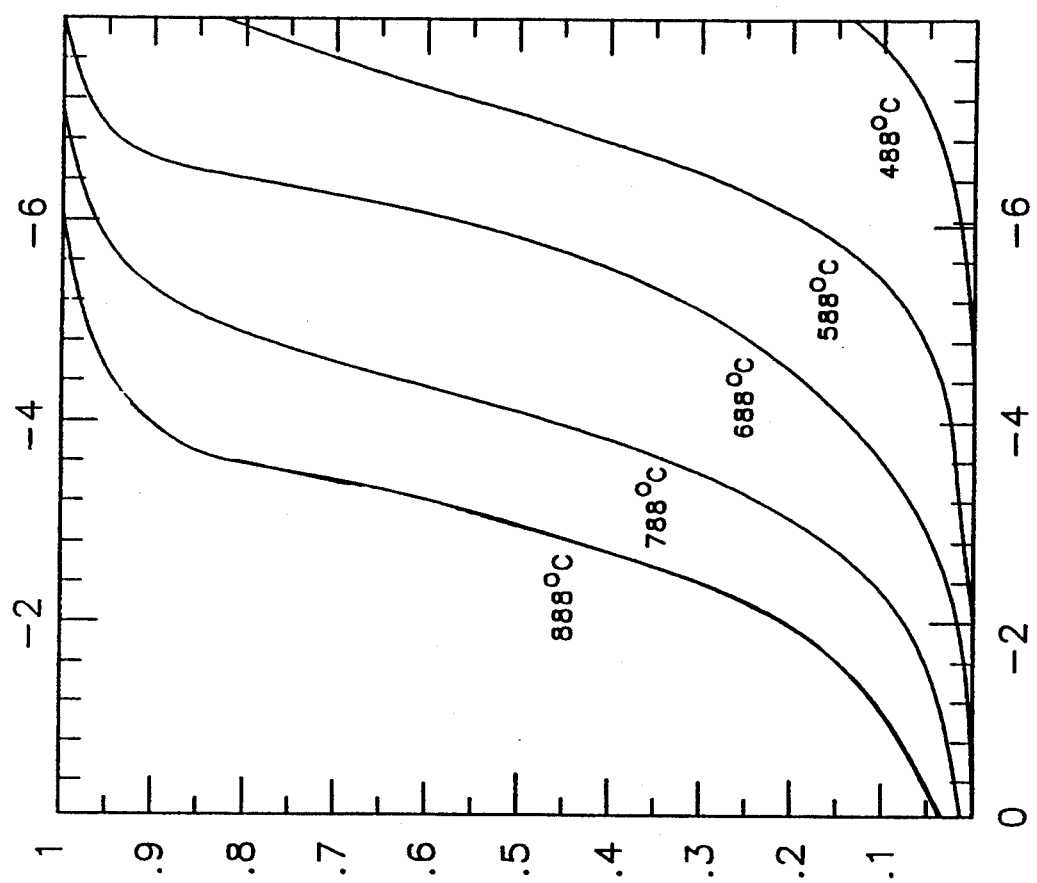
FIG. 4 shows known mole fraction curves for $P_2$–$P_4$ mixtures.
Figure 5:
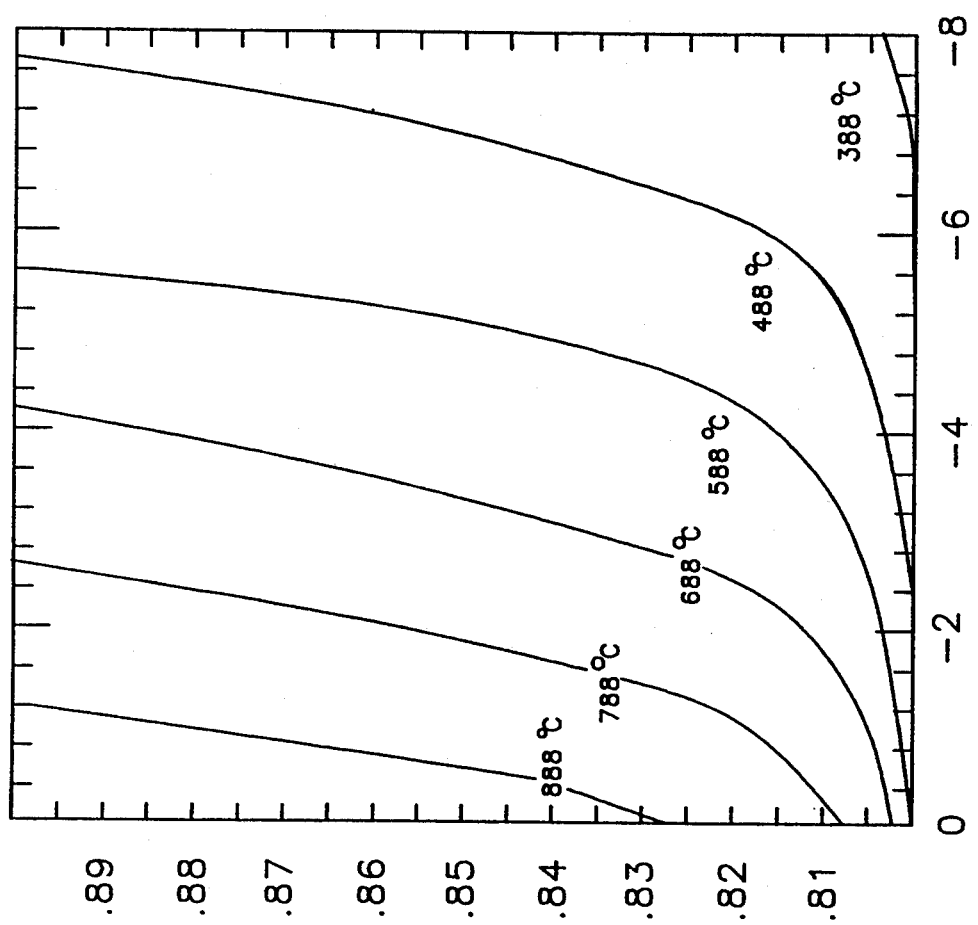
FIG. 5 is an expanded scale chart similar to FIG. 4.

In FIGS. 4 and 5, the mole fraction of $P_2$ in a $P_2+P_4$ mixture as a function of pressure and temperature is shown. The vertical ordinates are in mole fractions while the horizontal abscissa units are logarithm to base 10 of the total pressure of the mixture, in bars. The curve parameter is temperature in degrees centigrade FIG. 1 is helpful in understanding the peculiar behavior of the several phases and allotropes of phosphorus and shows $\log_{10}P$, the vapor pressure in bars along the ordinate plotted against $10^3/T$, the absolute temperature in °K, on the abscissa. Vapor pressure of the various varieties of phosphorus (monatomic P is not included) [Adapted from JANAF Thermochemical Tables, 2nd Edition, NERDS-NBS 37, Catalog Number C13.48:37 U.S. Government Printing Office, Washington, D.C., 1971]

Two auxiliary scales in °K and °C. have been drawn.

$P_w \rightarrow P_2$: Vapor pressure of white phosphorus giving diatomic phosphorous gas.

$P_r \rightarrow P_2$: Vapor pressure of red phosphorus giving diatomic phosphorous gas.

$P_w \rightarrow P_4$: Vapor pressure of white phosphorus giving tetratomic phosphorous gas.

$P_r \rightarrow P_4$: Vapor pressure of red phosphorus giving tetratomic phosphorus gas.

Whereas, according to FIG. 1, the $P_4$ pressure of red phosphorus at 300° C. is 8.49 mbar (point A), that of $P_2$ is $3.97 \times 10^{-5}$ mbar, as a result of which practically all the phosphorus may be considered to sublime as $P_4$. If the cold wall is at less than 100° C. (point B), the $P_4$ condenses on it in the form of white phosphorus, which is registered as the corresponding vapor pressure of phosphorus in the cell (4.48 mbar at 100° and $7.53 \times 10^{-2}$ mbar at 30° C.). However, if at some point in the cell (for example in the heating resistance) temperatures above 350° C. were to be reached as a result of the thermal dissociation $$P_4 \sim 2P_2$$

the equilibrium of which is shifted to the right, this being favored by low pressures and high temperatures as may be seen in FIG. 4 and 5, the fraction of $P_2$ which forms condenses on the walls in the form of red phosphorus and cannot be used in the process.

This condensation is due, as has been explained, to the dissociation of $P_4$ molecules on heating elements or filaments necessary for subliming red phosphorus contained in the crucible of the high temperature zone. The thermal dissociation of $P_4$ to $P_2$ normally requires temperatures above 600° C. in order to achieve a high efficiency of dissociation; however, at temperatures of the order of 300°–400° C. and on surfaces of refractory metals which act as catalysts, the dissociation yield obtained is sufficient for a condensation of $P_2$ on the cold walls to be obtained at an internal pressure of the order of $10^{-1}$–$10^{-2}$ mbar (see FIG. 5).

If the internal pressure is high, on the other hand, $P_2$–$P_2$ collisions in the gas phase favor recombination to $P_4$. To solve this problem, in the present invention, the temperature of any internal heating element is reduced to a minimum ($\sim 300°$ C.) by means of an optimization of the thermal insulation surrounding the crucible. Better thermal efficiency and greater equality of temperature of the heating elements and of the change of red phosphorus are thereby obtained, the catalytic dissociation and irreversible condensation of $P_2$ being minimized to the point where it becomes practically insignificant.

Lastly, at the beam exit at 1, there is an electrical resistance 2 of a refractory metal such as tantalum, which, on raising the temperature of the beam and catalyzing the dissociation of $P_4$, gives rise to the formation of $P_2$ (see FIG. 4), which is necessary for epitaxy.

Figure 6:
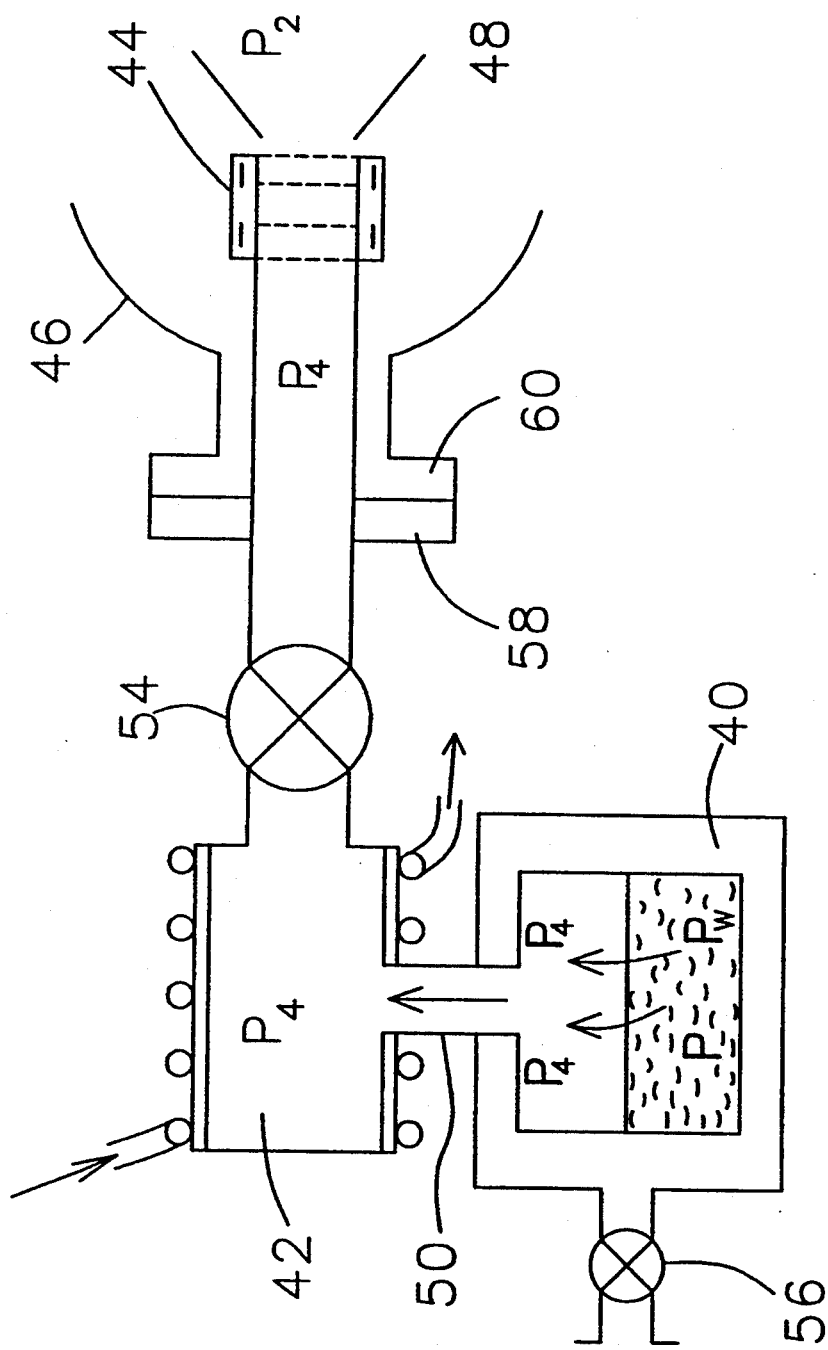
FIG. 6 is a schematic view of another embodiment of phosphorus effusion cell according to the invention.
Figure 7:
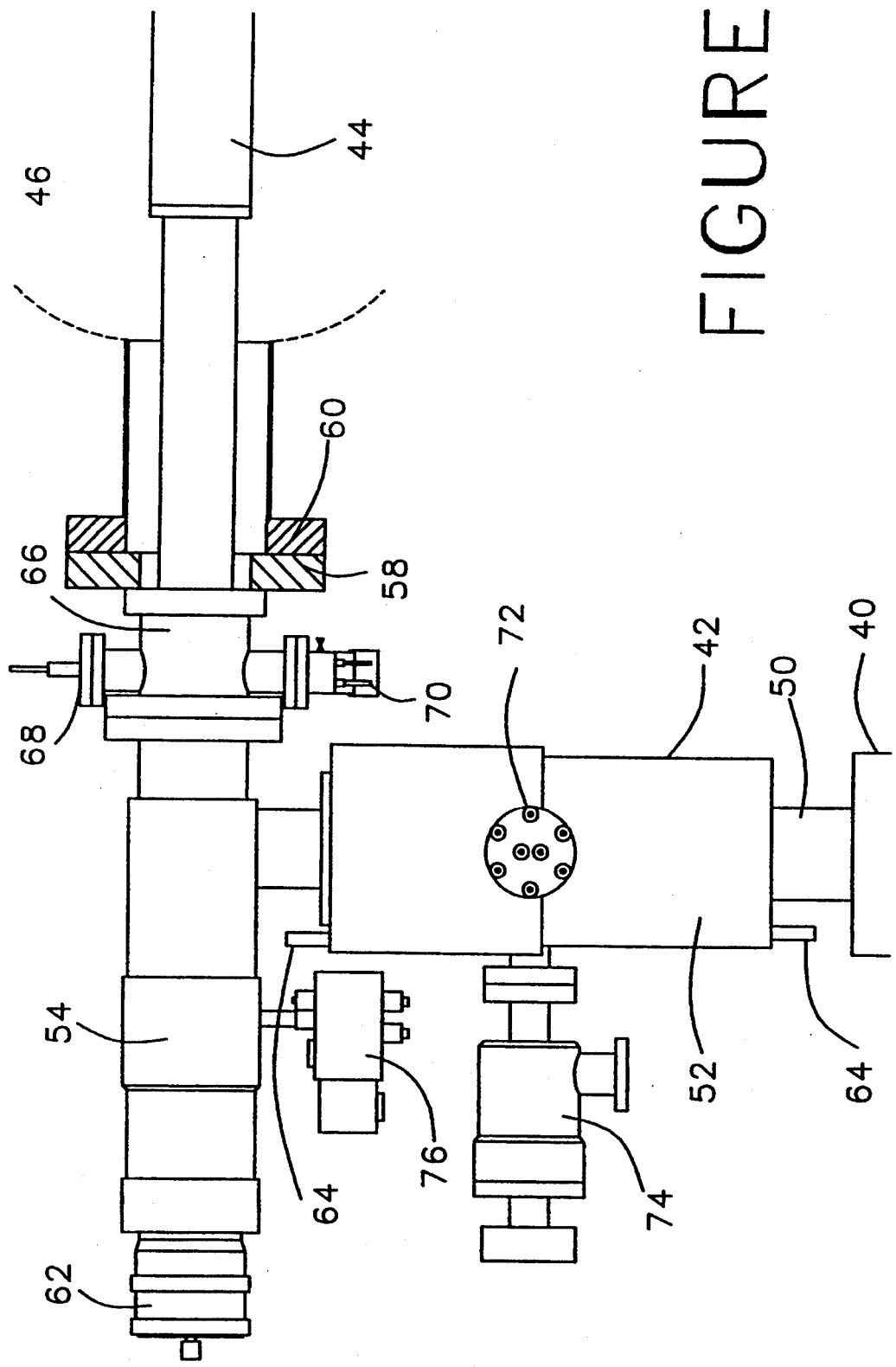
FIG. 7 is a more detailed view of an apparatus for realizing the embodiment schematically shown in FIG. 6.

Embodiments of FIGS. 6 and 7

In the schematic drawing of FIG. 6 an inventive phosphorus effusion cell embodying the principals of the invention comprises an evaporator 14, a phosphorus condenser 42 and a phosphorus cracker 44. Phosphorus cracker 44 is shown within an MBE chamber 46 discharging a phosphorus beam 48 comprising substantially only $P_2$ molecules and red phosphorus $P_4$ molecules. Here the condenser in chamber 42 is a discrete volume supplied from evaporator 40 through a physically distinct connection 50.

Condenser chamber 42 is a substantially cylindrical volume clear of heating elements, thermocouples or insulation associated with evaporator 40 and is cooled by a water jacket 52, the output from condenser chamber 42 is controlled by phosphorus flux valve 54.

In both this embodiment and the other embodiments described herein, because its probable or preferred operating temperature range is a moderate 50° to 80° C. phosphorus flux valve 54 can be a standard valve for example a conical valve engaging a sealing seat which may be elastomeric, formed for example of VITON (trademark), and is preferably actuated and closed pneumatically and also provided with a mechanically operable vernier control of its degree of opening. Valve 54 seals tightly, even under the ultra high vacuum conditions for practicing the invention. An optional vacuum connection is made to evaporator 40 at 56. Flange 58 of the effusion cell mates with MBE flange 60 and is such that in conjunction with operation of valve 54, the effusion cell is separable from the MBE chamber 46 without significant loss of vacuum, for example, for recharging purposes.

In the hardware realization of the FIG. 6 schematic design that is shown in FIG. 7 similar reference numerals are used to indicate similar components.

Referring to FIG. 7, it may be noted that the phosphorus condenser 42 and cracker 44 are generally cylindrical in shape and are disposed approximately orthogonally off-axis, one to another. In addition to common components with FIG. 6, the FIG. 7 embodiment has a flux-adjustment vernier control 62 for valve 54 and water connections 64 for water jacket 52. Behind the connection flange 58 is disposed a service head 66 which carries a cracking-stage filament connector 68 and a cracking-stage thermocouple flange 70. Also communicating with condenser chamber 42 are a burn-off filament 72 and an optional venting and pumping down valve 74. Actuation of valve 54, which is preferably pneumatic, is shown at 76.

Burn-off filament 72 enables all residual $P_{white}$ to be evaporated prior to opening the condenser 42 or the evaporator 40 to air for service or recharging. Residual white phosphorus is evaporated as the $P_4$ form and can be evacuated through the flux valve 54 and cracker 44, or through an optional vacuum valve 74 connected to an auxiliary vacuum unit.

Some optional but advantageous features of the phosphorus effusion cell shown in FIG. 7 are that the cracker 44 and flux valve 54 can be contained in a relatively long, small-diameter tube which is, for example 10 inches long for a 2.75 inch outside diameter MBE chamber flange. Preferably service head 66 comprises a rotatable flange whereby the evaporator-condenser unit can be oriented within an extensive angular range of for example, 75° to the axis of cracker 44, facilitating installation of the inventive phosphorus cell on an MBE chamber.

The cell disclosed herein is designed to fit a standard UHV conflat flange, e.g. a 35 CF flange, and has a low weight and large orientation range to be adaptable to most MBE systems.

From the foregoing disclosures, it will be apparent that the unique low-temperature flux control valves employed can be rated for ultra-high vacuum sealing, permitting disassembly of the cell chambers for service or recharging without requiring removal of the unit from the MBE chamber or loss of vacuum in that chamber.

Figure 9:
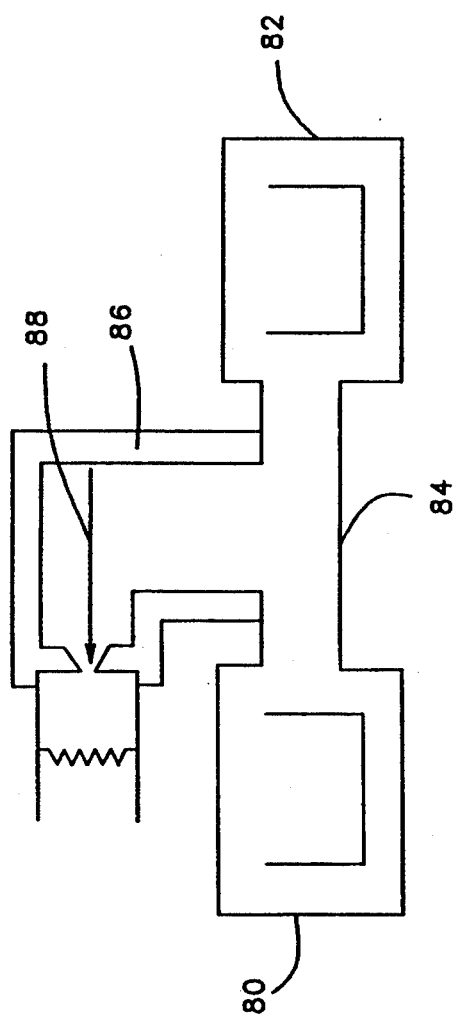
FIG. 9 is a schematic view, similar to FIG. 2, of another embodiment of phosphorus effusion cell according to the invention.

Embodiment of FIG. 9

In FIG. 9, the functions of phosphorus evaporation, white phosphorus condensation, and $P_4$ cracking to yield a $P_2$ beam, are clearly physically separated spatially and thermally. In the FIG. 9 concept, a red-phosphorus evaporator 80 and a separately defined white-phosphorus condenser 82 communicate through a separator tube 84. Separator tube 84 enables distinct temperature zones to be defined between the evaporator 80 and the condenser 82. Phosphorus vapor, comprised primarily of white phosphorus $P_4$ molecules, is drawn upwardly through cracker feed column 86 to flux control valve 88, which is in a low-temperature zone, and then to cracker 90 after which it is output to the MBE chamber.

As well as providing for temperature partitioning, the physical disposition in which evaporator 80 and condenser 82 are opposed along an axis from which cracker feed column 86 extends perpendicularly, provides a compact arrangement which, at the crowded head of an MBE chamber, can be particularly advantageous.

In addition to thermocouple control of the cracker 90, three further distinct zones of the cell are readily subject to independent temperature control. Evaporator 80 is heated and thermostated while white phosphorus condenser 82 is preferably water cooled. If desired, or necessary, in view of heat transfer from the cracker 90, the flux control valve 88 can be jacketed and cooled, to a suitable temperature in the range of about 40° to 100° C. depending upon condenser temperature as can the cracker feed column 86. In any event, valve 88 in this configuration has all the advantages of a relatively low temperature environment, preferably not above 100° C.

Phosphorus Beam Characteristics

Figure 8:
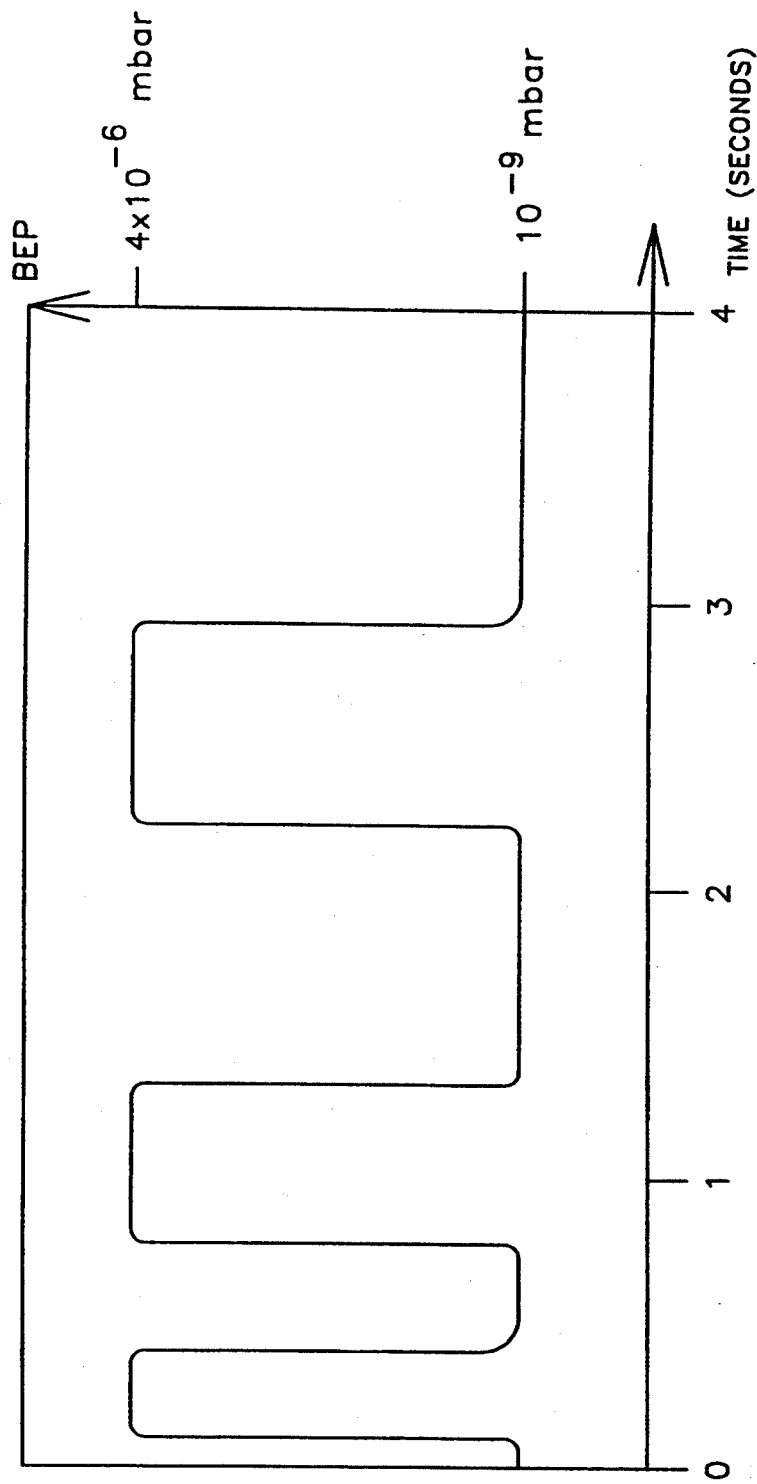
FIG. 8 is a graph of beam equivalent pressures obtainable with apparatus according to FIG. 7.

FIG. 8 shows sub-second valve pulsing obtainable with a cell constructed in accordance with the invention, for example, employing apparatus as described with reference to FIG. 7. The horizontal abscissa is time in seconds and the vertical ordinate plots beam equivalent pressure, of $P_2$ in mbar, with an effective plateau at about $4 \times 10^{-6}$ mbar, and an effective zero at about $10^{-9}$ mbar. Preferred beam-equivalent pressures for MBE growth of thin layer structures on semiconductor substrates, and especially for atomic layering of gallium and indium arsenide and phosphide materials in sophisticated structures such as strained layer short period superlattices, are in a range of from about $10^{-7}$ to about $10^{-5}$ mbar, and more preferably are of the $10^{-6}$ mbar order of magnitude.

Figure 10:
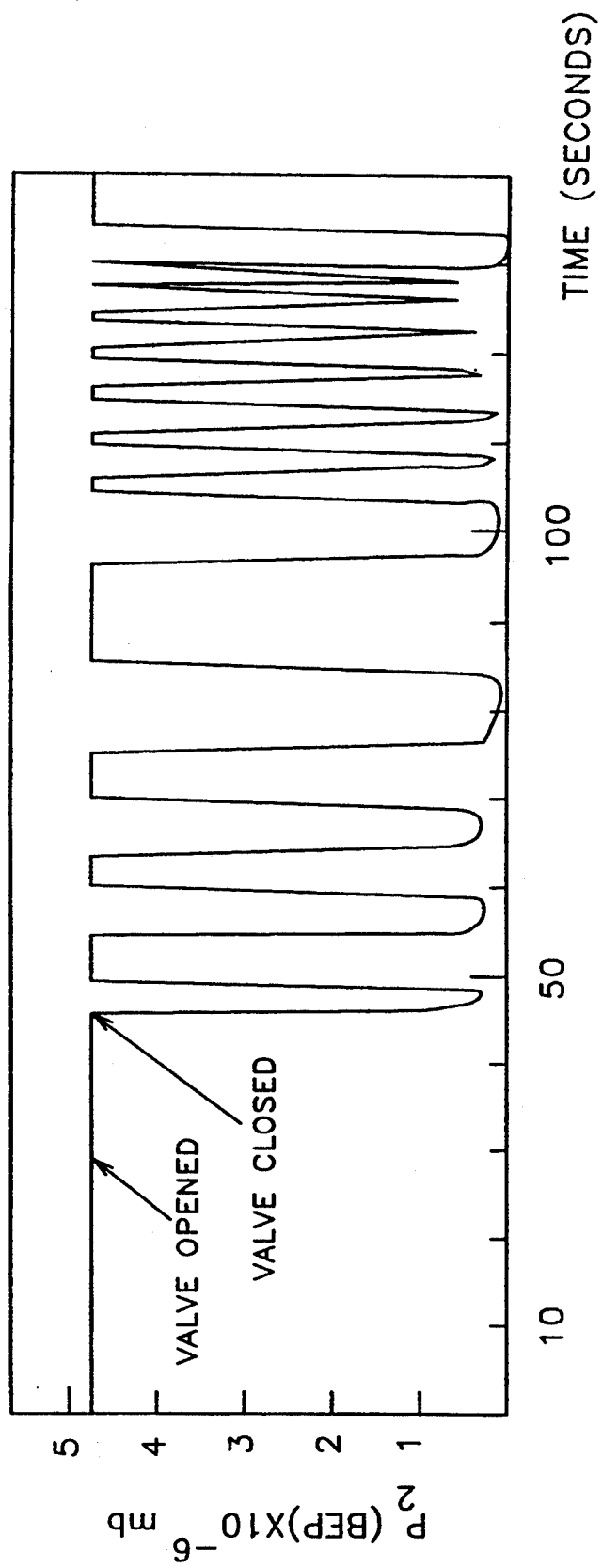
FIG. 10 is a further graph of beam equivalent pressures obtainable with apparatus according to FIG. 7.

The cell performance curve shown in FIG. 10 plots beam equivalent $P_2$ pressure in units of $10^{-6}$ mbar on the ordinate scale versus an extended time scale, in seconds, on the abscissa. Peaks represent fully open valve positions, while the arrow marking a point of valve closure enables the response time to be read, showing a rapid drop in beam pressure after closure. The right-hand side of the curve shows several fully open to fully closed cycles being accomplished in a 10-second interval. Valve operation can be driven by an electronically controlled air supply, preferably digitally, for full integration of phosphorus beam control into the MBE management systems under computer supervision.

As the consistency of the valve-open plateaus at about $4 \times 10^{-6}$ clearly shows, remarkably precise flux calibration and control is possible. Remarkable also are the speed with which peak flux is restored after reopening the valve as shown by the steepness of the up-ramps, and the complete absence of any measurable pressure overshoot in returning to full amplitude.

The phosphorus condensation zone is preferably cooled, for example by water, or by thermally regulated air flow, and to a preferred temperature which is maintained somewhere of the order of room temperature, for example, from 5° to 40° C. preferably between 10° and 30° C. Physico-chemical considerations dictate that the condenser temperature should be below 100° C. The output of the cooled condenser produces $P_4$ at a controllable pressure in a desirable pressure range which is approximately the same as that of red phosphorus at 300° C. In other words, the phosphorus output of the white condensation zone is comparable with that of a known high temperature red phosphorus systems but lacks their undesired pressure instabilities.

It follows that when practicing this invention, most of the $P_4$ molecules in the cracker stage have been generated from white phosphorus. It accordingly becomes possible to control the $P_4$ production by means of the condenser temperature which in turn is controlled by water or air temperature, if a coolant fluid is circulated around the condenser. Thus, $P_2$ beam equivalent pressure can be set by a simple thermostat adjustment of the condenser coolant temperature. Unusually low $P_2$ flux levels, of the order of $10^{-7}$ mbar. may be maintained by keeping the condenser cell walls at about 0° C.

As emphasized herein, provision of a lower temperature zone between the elevated temperature evaporation and cracking stages of the cell broadens the choices of valves that may be used to control the effusion cell's $P_2$ flux output because the flux control valve can be maintained in a relatively low temperature environment. In contrast, a known valve design for operating in the region of 300°–400° C. uses a refractory needle valve having a long shaft to transmit linear valve motion. This valve does not close well and is subject to reproducibility and hysteresis problems. Additional major drawbacks are that such known valves cannot pulse, nor can they seal against atmosphere to enable reloading.

Benefits Provided by the Invention

In summary, preferred embodiments of the present invention provide many advantages that are important in molecular beam epitaxial fabrication of semiconductor structures. Because a leak-tight separable seal is provided for attaching the cell to a MBE chamber and because the cell has a very short cycle time being the time required to reach temperature and pressure equilibrium, refilling of the phosphorus charge is easy and can be rapidly accomplished.

In turn, easy refillability facilitates the provision of relatively small capacity units such as 40 cc. 100 cc in addition to more conventional, higher capacity cells such as 200 cc. Though an apparently rather small capacity, such units are adequate for many MBE processes, especially atomic layer growth processes, because very little raw material is consumed. Preferred embodiments can thus have a very low thermal time constant which provides the great advantage, when equipped with suitable valving, as disclosed herein, of enabling them to be operated in pulse mode. Pulsing is of value in MBE fabrication processes and provides new techniques for delimiting semiconductor structures.

By means of the invention, a high-content $P_2$ beam can be output and, under optimal conditions, $P_4$ can be substantially eliminated from the output beam. Because low temperature valve systems can be employed the beam is highly controllable mechanically, providing a stable, reproducible beam which can be pulsed and accurately calibrated. Additionally, the inventive phosphorous effusion cell disclosed herein offers a unique capability of producing a sharply defined $P_2$ flux in either constant or pulse mode without pressure overshoot on opening.

As described above, the problem of an initial pressure burst is also substantially eliminated by the inventive phosphorus condensation means which control the diverse phosphorus vapor phases, leading to good and reproducible phosphorus beam performance.

Also, eliminating risks of discharging white phosphorus reduces potential dangers from phosphorus effusion cell operation. The inventive embodiments are effective in converting white phosphorus into red before discharging the phosphorus beam.

The use of pneumatic control means and mechanically operable vernier control, with vacuum-tight valving, to control the output phosphorus flux permits the beam to be shut off, or turned on and quantitatively controlled accurately, remotely and easily. Such valving systems avoid problems of valve jittering or wobble and excessive hysteresis, to which the high temperature valves necessitated by prior systems are subject.

The unique white-phosphorus condensation zone or stage provided by the present invention supplies a reservoir of volatile phosphorus from which a more controllable vapor stream than heretofore obtainable is generated. In contrast, known systems require relatively high temperatures to generate $P_4$ flux from red phosphorus and have no means to control phosphorus phase changes. Consequently, the output flux is unstable with time and is not well suited to use in MBE. It is difficult to use in fabricating quaternary layers such as GaInAsP.

Molecular Beam Epitaxy Growth Processes and Products

A problem in fabricating optoelectronic devices by thin-layer, epitaxial growth on silicone substrates employing mixed Group V elements, by means of molecular beam epitaxy, is that considerable difficulty may be encountered, in known methods, in controlling the necessary phosphorus stream. For adequate fabricated device product quality, a desirable phosphorus beam characteristic is a known and steady beam equivalent pressure of $P_2$ molecules, without any initial burst pressure. Also, desirable are pulsed beam modes with controllable sharp interfaces and sub-second cycle times, or pulse frequencies.

As described extensively herein, the present invention solves these problems by providing a phosphorus effusion cell having all these desired characteristics. By coupling the inventive cell to the cell port of an MBE chamber, new MBE processes become possible, resulting in high quality layered devices which lack the problems of devices produced by known methods and apparatus, and in particular, problems related to excess phosphorus surface growth avoided.

For example, in growing n-type InP good optical quality can be obtained using output from a phosphorus effusion cell according to the invention, with $n \approx 5 \times 10^{16}$ cc$^{-3}$.$P_2$, and a temperature in the range of about 270° to 350° C. in an otherwise standard MBE system. By controlling the substrate temperature range to avoid phosphorus desorption from the InP surface, efficient incorporation of phosphorus on an In atomic layer, can be achieved, using a low beam equivalent pressure of $P_2$, obtained from the inventive cell with a pulse amplitude less than about $10^{-5}$ mbar and a pulse duration typically less than a second. On/off fluxes of the $P_2$ beam in excess of $10^3$ are obtainable. Such structures have application in fabrication of devices emitting in the region of 1.5 μm.

Similar phosphorus beam characteristics are valuable in new or modified MBE systems for growing strained layer short-period superlattices employing GaAS/GaP growth on GaAs substrates. Such new MBE methods provide a more easily controlled growth system yielding alternative, strained layer short-period superlattices of good quality. The materials can be used as confining material for gallium indium arsenide multiquantum well heterostructures. Other methods and devices that may be produced by new MBE methods exploiting the stable, well-controlled phosphorus beam produced by the novel phosphorus effusion cell and beam propagation methods described herein, will be apparent to those skilled in the art. The present invention extends to such methods and devices.

Phosphorus Equivalents

While the invention has been described as a method and apparatus that are particularly adapted to solve problems of a phosphorus diffusion cell and which solve the special problems that arise in subliming or evaporating and cracking red phosphorus, those skilled in the art will appreciate that other materials might be used with adjustments to take account of the respective physical constants of such other materials. In particular, the unique condensation stage provided between sublimation and cracking provides a means of controlling a volatile unstable phase of a starting material displaying multiple phases or allotropes.

While an illustrative embodiment of the invention has been described above, it is, of course, understood that various modifications will be apparent to those of ordinary skill in the art. Such modifications are within the spirit and scope of the invention, which is limited and defined only by the appended claims.

I claim:

1. An evacuated phosphorus effusion cell capable of outputting a phosphorus vapor stream for molecular beam epitaxy said phosphorus effusion cell comprising:
   a) a red phosphorus sublimation chamber to generate said phosphorus vapor stream;
   b) a phosphorus cracker to crack $P_4$ phosphorus in said phosphorus vapor stream to $P_2$ phosphorus; and
   c) a white phosphorus condensation region located downstream of said sublimation chamber and upstream of said phosphorus cracker.

2. A phosphorus effusion cell according to claim 1 comprising temperature controlling means for said sublimation chamber and said condensation region, said temperature controlling means being operative to generate a pressure-buffering white phosphorus deposit in said condensation region to pressure-stabilize said output phosphorus vapor stream.

3. A phosphorus effusion cell according to claim 2 wherein said temperature controlling means comprises independently operable thermostatting for said sublimation chamber and for said condensation region.

4. A phosphorus effusion cell according to claim 2 wherein said temperature controlling means comprises cooling means for said condensation region.

5. A phosphorus effusion cell according to claim 2 comprising a flux control valve to control the flow of said phosphorus vapor stream wherein said temperature controlling means comprises cooling means for said condensation region and said flux control valve is located to be subject to cooling from said cooling means.

6. A phosphorus effusion cell according to claim 5 wherein said flux control valve is a rapid-actuation valve.

7. A phosphorus effusion cell according to claim 6 wherein said flux control valve is sealable against high vacuum and comprises low-temperature valving including an elastomeric seal.

8. A phosphorus effusion cell according to claim 7 wherein said flux control valve comprises a bellows and said low-temperature valving includes a conical valve member carried by said bellows to be pressed against said elastomeric seal for hermetic sealing of said effusion cell.

9. A phosphorus effusion cell according to claim 6 wherein said flux control valve comprises a valve member having a hard, jeweled sealing surface and a soft metal valve seat.

10. A phosphorus effusion cell according to claim 5 wherein said flux control valve has a flux-adjustment vernier control.

11. A phosphorus effusion cell according to claim 2 wherein said condensation region occupies a well-defined volume and said effusion cell comprises a physically distinct connection between said sublimation chamber and said condensation region.

12. A phosphorus effusion cell according to claim 2 comprising a substantially cylindrical condensation chamber defining said condensation region said condensation chamber being substantially unobstructed by heating elements, thermocouples, insulation and other heat-control means.

13. A phosphorus effusion cell according to claim 2 comprising a water jacket around said condensation chamber.

14. A phosphorus effusion cell according to claim 2 wherein said sublimation chamber and said phosphorus cracker are generally tubular and are disposed approximately orthogonally off-axis, one to another.

15. A phosphorus effusion cell according to claim 5 comprising pnuematic actuation means for said flux control valve.

16. A phosphorus effusion cell according to claim 2 comprising in communication with said condensation region a burn-off filament and a venting and pumping down valve.

17. A phosphorus effusion cell according to claim 4 wherein said phosphorus cracker comprises a thermostatted electrical resistance filament heater and a thermocouple.

18. A phosphorus effusion cell according to claim 17 comprising a service head for connection to an MBE chamber, said service head comprising a filament connector for said filament and a thermocouple flange.

19. A phosphorus effusion cell according to claim 18 wherein said service head comprises a rotatable flange for mounting on said MBE chamber.

20. A phosphorus effusion cell according to claim 1 comprising, within said effusion cell, thermal insulation around said phosphorus sublimation chamber, said thermal insulation comprising spot-welded spaced apart layers of tantalum foil or sheet.

21. An evacuated phosphorus effusion cell capable of outputting a phosphorus vapor stream and comprising:
   a) a red phosphorus sublimation chamber heatable to a first temperature to generate said phosphorus vapor stream;
   b) a flux valve to control said outputting of said phosphorus vapor stream; and
   c) cooling means to cool said phosphorus vapor stream downstream of said sublimation chamber;
wherein said flux control valve is located to be subject to cooling from said cooling means.

22. A phosphorus effusion cell according to claim 21 wherein said flux control valve is a rapid-actuation valve, is sealable against high vacuum and comprises low-temperature valving.

23. A phosphorus effusion cell according to claim 22 wherein said effusion cell further comprises a phosphorus cracker to crack $P_4$ phosphorus in said phosphorus vapor stream to $P_2$ phosphorus, said phosphorus cracker being located downstream of said flux control valve.

24. In combination, a molecular beam epitaxy chamber and a phosphorus effusion cell according to claim 2 coupled to said molecular beam epitaxy chamber to supply a surge-controlled phosphorus beam to said molecular beam epitaxy chamber.

25. A phosphorus effusion cell for producing a flow of phosphorus vapor regulated by a valve, said phosphorus effusion cell comprising:
   a) a vessel for sublimation of red phosphorus to phosphorus vapor to said flow of phosphorus vapor; and
   b) a vacuum-tight valve closing said vessel and openable to output said phosphorus vapor flow, said valve regulating said phosphorus vapor flow;
wherein said vessel has two zones, said zones being independently thermostatted to different temperatures and comprising a hot zone for sublimation of red phosphorus to produce phosphorus vapor and a cold zone for condensation of white phosphorus from said phosphorus vapor and re-evaporation of said white phosphorus; and wherein said cold zone is located downstream from said hot zone and upstream from said vacuum-tight valve, whereby phosphorus can flow from said hot zone to said vacuum-tight valve via said cold zone.

26. A phosphorus effusion cell according to claim 25 further comprising a thermal cracker downstream of said cold zone to dissociate $P_4$ molecules to $P_2$ molecules.

27. A phosphorus effusion cell according to claim 26 operable to produce a phosphorus beam for molecular beam epitaxy wherein said hot and cold zones of said vessel and said vacuum-tight valve are maintained at temperatures below about 350° C.

28. A phosphorus effusion cell according to claim 25, wherein said vacuum-tight valve is maintained at a temperature above that of said cold zone and said cold zone temperature is below about 100° C.

29. A phosphorus effusion cell according to claim 25, comprising an electrical resistance heater to elevate the temperature of the hot zone and a temperature sensor to monitor the temperature at said resistance heater, said resistance heater temperature being controlled to not rise above 350° C.

30. A phosphorus effusion cell according to claim 25, comprising thermal insulation between said hot zone and said cold zone, said thermal insulation comprising multiple heat-reflecting screens surrounding said hot zone.

* * * * *